(12) United States Patent
Zhu

(10) Patent No.: US 11,791,425 B2
(45) Date of Patent: Oct. 17, 2023

(54) PREPARATION METHOD FOR SOLAR CELL BACK ELECTRODE AND APPLICATION THEREOF

(71) Applicant: NANTONG T-SUN NEW ENERGY CO., LTD., Jiangsu (CN)

(72) Inventor: Peng Zhu, Jiangsu (CN)

(73) Assignee: NANTONG T-SUN NEW ENERGY CO., LTD., Jiangsu (CN)

( * ) Notice: Subject to any disclaimer, the term of this patent is extended or adjusted under 35 U.S.C. 154(b) by 520 days.

(21) Appl. No.: 17/279,105

(22) PCT Filed: Aug. 2, 2018

(86) PCT No.: PCT/CN2018/098232
§ 371 (c)(1),
(2) Date: Mar. 24, 2021

(87) PCT Pub. No.: WO2020/015021
PCT Pub. Date: Jan. 23, 2020

(65) Prior Publication Data
US 2021/0391482 A1  Dec. 16, 2021

(30) Foreign Application Priority Data

Jul. 16, 2018  (CN) .......................... 201810774371.3

(51) Int. Cl.
*H01L 31/02* (2006.01)
*C09D 5/24* (2006.01)
(Continued)

(52) U.S. Cl.
CPC ........ *H01L 31/022425* (2013.01); *C09D 5/24* (2013.01); *C09D 7/20* (2018.01);
(Continued)

(58) Field of Classification Search
CPC ..... H01L 31/022425; H01L 31/022433; H01L 31/022441; C09D 5/24; C09D 7/61; C09D 7/63; C09D 7/70; Y02E 10/50
See application file for complete search history.

(56) References Cited

U.S. PATENT DOCUMENTS

| 5,118,362 A | * | 6/1992 | St. Angelo | ...... H01L 31/022425 |
| | | | | 438/98 |
| 2013/0061918 A1 | * | 3/2013 | Hang | .............. H01L 31/022425 |
| | | | | 257/E31.124 |

(Continued)

FOREIGN PATENT DOCUMENTS

| CN | 101236997 | 8/2008 |
| CN | 107591218 | 1/2018 |
| JP | 10472764 | 3/1992 |

OTHER PUBLICATIONS

"International Search Report (Form PCT/ISA/210) of PCT/CN2018/098232", dated Mar. 22, 2019, with English translation thereof, pp. 1-4.

*Primary Examiner* — Omar F Mojaddedi
(74) *Attorney, Agent, or Firm* — JCIP GLOBAL INC.

(57) ABSTRACT

A preparation method for a solar cell back electrode and an application thereof are provided. The method comprises setting a back electrode barrier layer and using back-side silver paste in coordination. The back electrode barrier layer comprises the following components: 20 to 80 parts by weight of metal nitride powder, nitrogen-silicon compound powder, oxide powder or low-melting-point metal powder in total; 0.5 to 5 parts by weight of lead-free glass powder; 10 to 40 parts by weight of organic carrier; and 0.1 to 1 part by weight of organic additives. The back-side silver paste comprises the following components: 5 to 60 parts by weight of hollow spherical silver powder; 5 to 30 parts by weight of flaky silver powder; 0.5 to 5 parts by weight of (Continued)

lead-free glass powder; 10 to 50 part by weight of organic binder; and 0.1 to 1 part by weight of organic additives.

10 Claims, 4 Drawing Sheets

(51) Int. Cl.
    *C09D 7/20* (2018.01)
    *C09D 7/61* (2018.01)
    *C09D 7/40* (2018.01)
    *H01L 31/18* (2006.01)
    *H01L 31/0224* (2006.01)

(52) U.S. Cl.
    CPC ............... *C09D 7/61* (2018.01); *C09D 7/70* (2018.01); *H01L 31/18* (2013.01)

(56) References Cited

U.S. PATENT DOCUMENTS

| | | | |
|---|---|---|---|
| 2015/0228841 A1* | 8/2015 | Murakami | H01L 31/068 438/72 |
| 2015/0372171 A1* | 12/2015 | Wang | C09D 5/24 252/514 |
| 2017/0148936 A1* | 5/2017 | Zhu | H01L 31/022425 |
| 2018/0053873 A1* | 2/2018 | Doll | H01L 31/0682 |
| 2020/0185547 A1* | 6/2020 | Mitta | H01L 31/1868 |

* cited by examiner

PREPARATION METHOD FOR SOLAR CELL BACK ELECTRODE AND APPLICATION THEREOF

CROSS-REFERENCE TO RELATED APPLICATION

This application is a 371 of international application of PCT application serial no. PCT/CN2018/098232, filed Aug. 2, 2018, which claims the priority benefit of China application no. 201810774371.3, filed on Jul. 16, 2018. The entirety of each of the above mentioned patent applications is hereby incorporated by reference herein and made a part of this specification.

TECHNICAL FIELD

The disclosure belongs to the technical field of solar cells, and particularly relates to a preparation method for a solar cell back electrode and an application thereof.

BACKGROUND

At present, the main function of back-side silver paste for solar cells is to provide welding points for the back of a solar cell, so there are high requirements on it in terms of weldability, welding resistance, adhesion, efficiency improvement, cost reduction and other aspects. Good back-side silver paste should have the following advantages: low activity, reduction of the reaction between glass powder and a passivation film, prevention of the formation of a large number of recombination centers at the contact part between silver paste and a silicon wafer or aluminum paste, increasing of the open-circuit voltage of cells, wide process window, adaptation to a low-temperature sintering process, excellent adhesion and aging tensile strength, good printing properties and low silver content.

In PERC (Passivated Emitter and Rear Contact) cells, the main functions of back-side silver paste are simply convergence and welding point, and is not intended to contact silicon. The direct printing of back-side silver paste onto aluminum paste may cause two problems: firstly, the mutual contact between silver and aluminum will affect the welding property of a back electrode; and secondly, the edge of the back electrode needs to be covered by an aluminum back surface field, increasing of the width of the back electrode and the cost of the back electrode paste.

Therefore, for the production of a back electrode, how to reduce the formation of silver-aluminum alloy and contact between silver and a silicon wafer has become a research subject.

SUMMARY

The disclosure provides a preparation method for a solar cell back electrode and an application thereof.

A preparation method for a solar cell back electrode comprises the following steps: a layer of conductive barrier layer paste is printed or sprayed on back-side aluminum paste, and the barrier layer paste is directly printed on a back-side aluminum electrode; after drying, back-side silver paste in coordination is printed on the barrier layer paste and dried; and after sintering, a back electrode is formed.

Preferably, the barrier layer paste comprises the following components: 20 to 80 parts by weight of metal nitride powder, nitrogen-silicon compound powder, oxide powder or low-melting-point metal powder in total; 0.5 to 5 parts by weight of lead-free glass powder; 10 to 40 parts by weight of organic binder; and 0.1 to 1 part by weight of organic additives.

Preferably, the back-side silver paste in coordination comprises the following components: 5 to 60 parts by weight of hollow spherical silver powder with purity greater than 99.99% under special requirements; 5 to 30 parts by weight of flaky silver powder; 0.5 to 5 parts by weight of lead-free glass powder; 10 to 50 parts by weight of organic binder; and 0.1 to 1 part by weight of organic additives, wherein the grain size D50 of the hollow spherical silver powder is 5 μm to 20 μm, and the grain size D50 of the flaky silver powder is 2 μm to 30 μm.

Preferably, the metal nitride powder comprises one or more of ZrN, TiN, TaN, MoN and CaN, with the grain size D50 being 0.1 μm to 10 μm;

the nitrogen-silicon compound powder comprises one or more of SiNx, BNx and VNx, with the grain size D50 being 0.3 μm to 15 μm; and the oxide powder comprises one or more of $Al_2O_3$, $SiO_2$, $TiO_2$, ZrO, $SnO_2$, $MoO_2$, CaO and NiO, with the grain size D50 being 0.3 μm to 15 μm.

Preferably, the lead-free glass powder is prepared by: melting several of $Bi_2O_3$, $B_2O_3$, ZnO, $TeO_2$, $SiO_2$, $MnO_2$, CaO, $Al_2O_3$, CuO, SrO and BaO in parts by weight, with the grain size D50 being controlled at 0.7 μm to 5 μm and the softening point being adjustable within a range from 500° C. to 700° C.

Preferably, the organic binder comprises the following components: 1 to 30 parts by weight of organic resin; 50 to 90 parts by weight of organic solvent; and 0.5 to 10 parts by weight of organic additives.

Preferably, the lead-free glass powder is prepared by melting several of $Bi_2O_3$, $B_2O_3$, $SiO_2$, $Na_2O$, $MnO_2$, CaO, $Al_2O_3$, CuO, ZnO, SrO, BaO and $TeO_2$, with the grain size D50 being controlled at 0.3 μm to 3 μm and the softening point being adjustable within a range from 400° C. to 600° C.

Preferably, the organic binder comprises the following components: 0.5 to 20 parts by weight of organic resin; 40 to 90 parts by weight of organic solvent; and 0.5 to 10 parts by weight of organic additives.

Preferably, the barrier layer paste can be directly sprayed or printed on aluminum paste, back electrode width and printed pattern can be adjusted optionally, and the thickness is about 1 μm to 5 μm; and the barrier layer has a bidirectional barrier function, which not only can prevent the mutual diffusion between aluminum and silver, but also can prevent the mutual diffusion between silver and silicon.

An application of the preparation method for a barrier layer, in which the preparation method for a solar cell back electrode is applicable but not limited to PERC cell back electrodes, and is also applicable to full-area aluminum back surface field cells or cells with a high back side passivation degree, sensitive and thin passivation layers which can be damaged easily, and mainstream passivation layers such as SiNx, $Al_2O_3$ and $SiO_2$.

The disclosure is provided as follows:

1. In the application of the solar cell back electrode of the disclosure, back electrode width and printed pattern can be adjusted optionally, thereby reducing the cost of back electrode paste. In order to reduce unit consumption and recombination, the printed pattern of the back-side silver paste may be hollowed out, strip hollowed out or dot hollowed out, with the blocking proportion being 25% to 50%.

2. The disclosure achieves the isolation between silver and aluminum and between silver and silicon by performing printing twice or multiple times, and the preparation method for a back electrode is applicable to full-area aluminum back surface field solar cells or solar cells with a high back side passivation degree. The application of the barrier layer can reduce the formation of silver-aluminum alloy, thus increasing the weldability and welding resistance of the paste and the welding tensile strength of the back electrode.

3. Since the silver powders with different grain sizes and shapes are chosen to be used in cooperation in the disclosure, the bulk density of a conducting film is increased, the contact area between silver particles is enlarged, the contraction force of the conducting film is decreased, and the electric conductivity of the paste is increased.

4. Since the back-side silver paste and barrier layer paste of the disclosure adopt lead-free glass powder, the use of leaded glass powder is avoided, thus better meeting the requirements of environmental protection. Moreover, the glass powder is adjusted to have appropriate activity, so that the glass powder and the silver powder have appropriate wettability, enabling the paste to have appropriate sintering temperature, and thereby the overall properties of the paste are improved.

5. The preparation method for a back electrode in the disclosure ensures that it has considerable welding tensile strength and aging tensile strength, and prevents the severe electric leakage problem caused by metal defects as a result of the direct contact between silver and a silicon wafer or aluminum paste, and thereby the photoelectric conversion efficiency of crystalline silicon cells can be increased.

DESCRIPTION OF THE EMBODIMENTS

Figure 1:
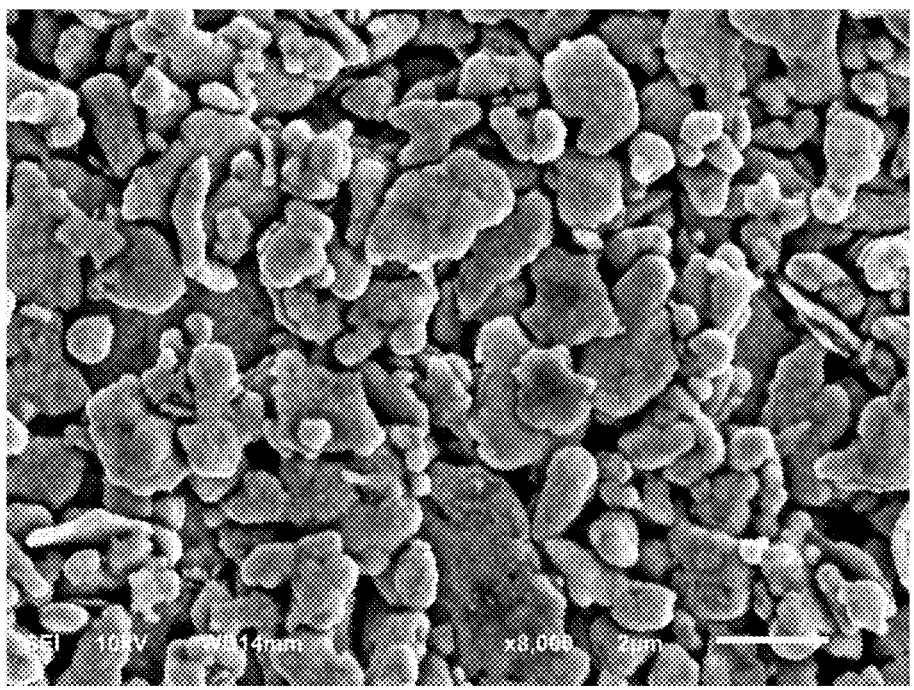
FIG. 1 is a schematic diagram of flaky silver powder of the disclosure.
Figure 2:
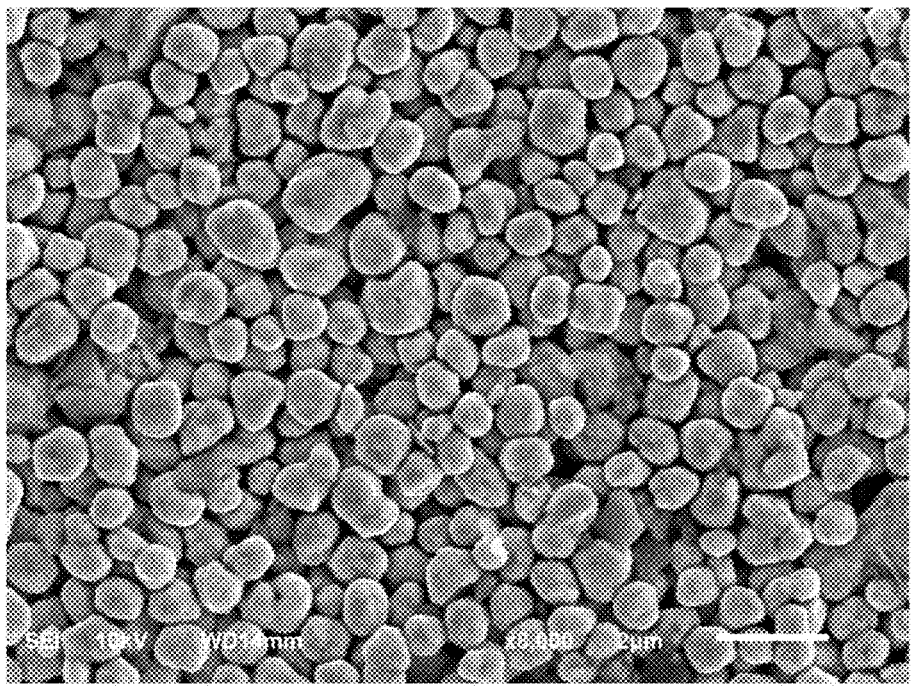
FIG. 2 is a schematic diagram of micron-scale hollow spherical silver powder of the disclosure.
Figure 3:
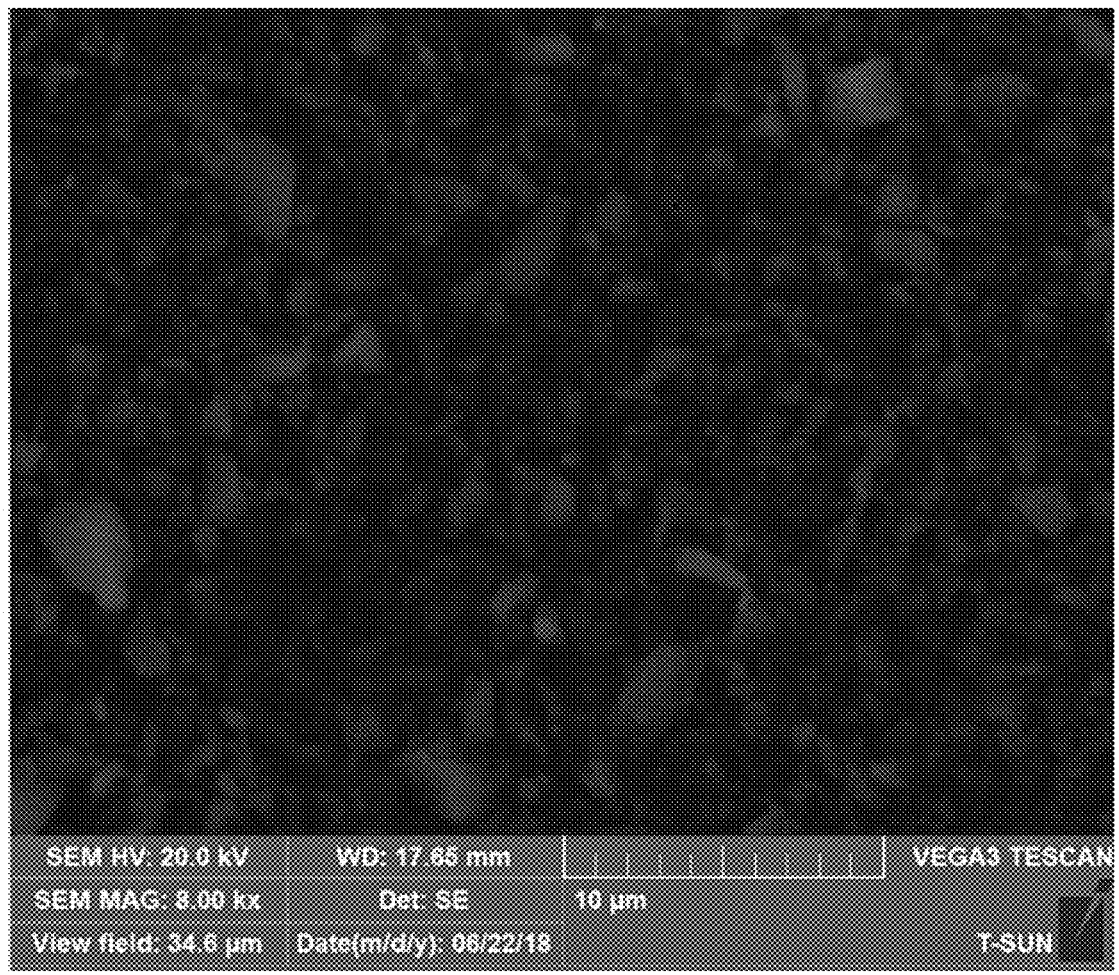
FIG. 3 is a schematic diagram of micron-scale spherical nitrogen-silicon compound powder of the disclosure.
Figure 4:
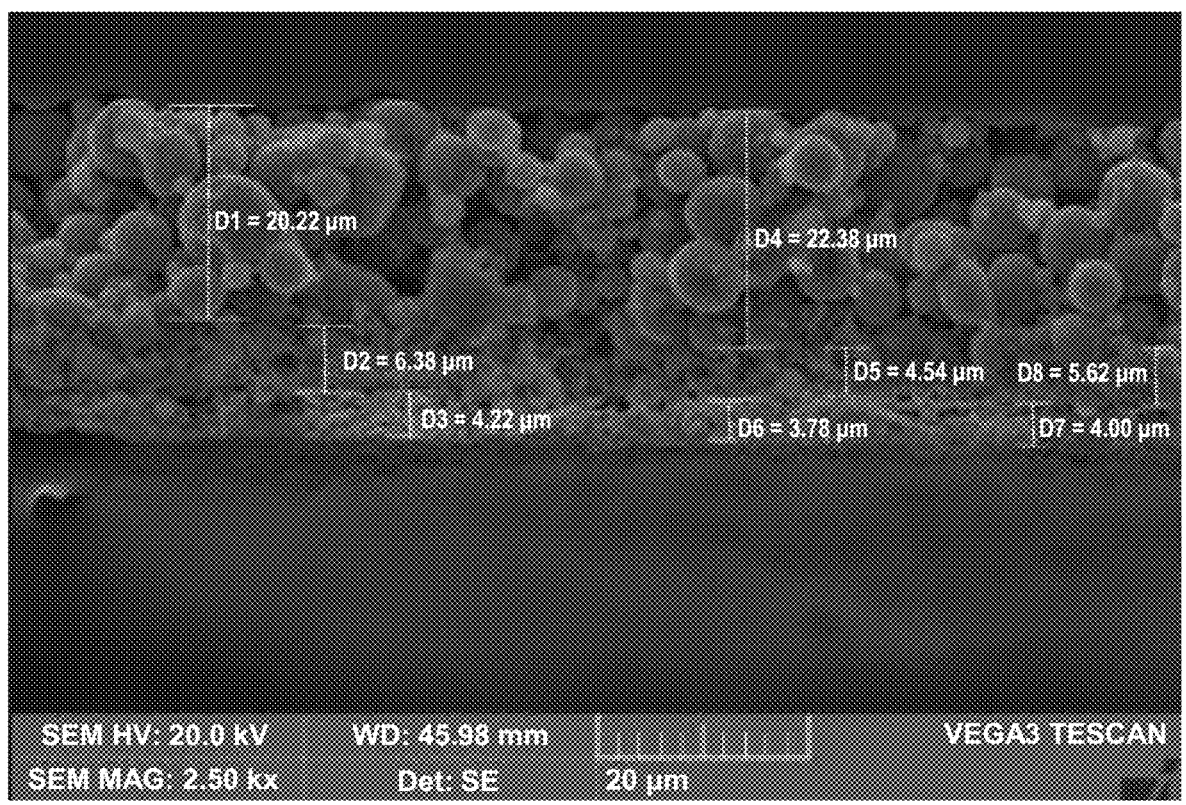
FIG. 4 is an SEM image of the cross section of a back electrode with a printed barrier layer.

The disclosure will be clearly and described below, so that those skilled in the art can better understand the disclosure, and thus the protection scope of the disclosure can be defined more clearly. The embodiments described in the disclosure are only part of the embodiments of the disclosure rather than all of them. Based on the embodiments of the disclosure, all other embodiments which are achieved by those of ordinary skill in the art without doing creative work shall fall within the protection scope of the disclosure.

Embodiment 1

A preparation method for a solar cell back electrode comprises the following steps: a layer of conductive barrier layer paste is printed or sprayed on back-side aluminum paste, and the barrier layer paste is directly printed on a back-side aluminum electrode; after drying, back-side silver paste in coordination is printed on the barrier layer paste and dried; and after sintering, a back electrode is formed.

The barrier layer paste comprises the following components: 67 parts by weight of metal nitride powder, nitrogen-silicon compound powder, metal oxide powder or low-melting-point metal powder in total; 3 parts by weight of lead-free glass powder; 29.8 parts by weight of organic binder; and 0.2 parts by weight of organic additives.

The back-side silver paste in coordination comprises the following components: 42 parts by weight of hollow spherical silver powder with purity greater than 99.99% under special requirements; 15 parts by weight of flaky silver powder; 2.5 parts by weight of lead-free glass powder; 40.1 parts by weight of organic binder; and 0.4 parts by weight of organic additives, wherein the grain size D50 of the hollow spherical silver powder is 1 μm, and the grain size D50 of the flaky silver powder is 6 μm.

The metal nitride powder comprises one or more of ZrN, TiN, TaN, MoN and CaN, with the grain size D50 being 0.1 μm.

The nitrogen-silicon compound powder comprises one or more of SiNx, BNx and VNx, with the grain size D50 being 0.3 μm.

The oxide powder comprises one or more of $Al_2O_3$, $SiO_2$, $TiO_2$, ZrO, $SnO_2$, $MoO_2$, CaO and NiO, with the grain size D50 being 0.3 μm.

The lead-free glass powder is prepared by: melting several of $Bi_2O_3$, $B_2O_3$, ZnO, $TeO_2$, $SiO_2$, $MnO_2$, CaO, $Al_2O_3$, CuO, SrO and BaO in parts by weight, with the grain size D50 being controlled at 0.7 μm and the softening point being adjustable within a range of 500° C.

The organic binder comprises the following components: 17 parts by weight of organic resin; 80 parts by weight of organic solvent; and 3 parts by weight of organic additives.

The lead-free glass powder is prepared by melting several of $Bi_2O_3$, $B_2O_3$, $SiO_2$, $Na_2O$, $MnO_2$, CaO, $Al_2O_3$, CuO, ZnO, SrO, BaO and $TeO_2$, with the grain size D50 being controlled at 0.3 μm and the softening point being adjustable within a range of 400° C.

The organic binder comprises the following components: 21 parts by weight of organic resin; 75 parts by weight of organic solvent; and 4 parts by weight of organic additives.

The barrier layer paste can be directly sprayed or printed on aluminum paste, back electrode width and printed pattern can be adjusted optionally, and the thickness is about 4.5 μm; and the barrier layer has a bidirectional barrier function, which not only can prevent the mutual diffusion between aluminum and silver, but also can prevent the mutual diffusion between silver and silicon.

An application of the preparation method for a barrier layer, in which the preparation method for a solar cell back electrode is applicable but not limited to PERC cell back electrodes, and is also applicable to full-area aluminum back surface field cells or cells with a high back side passivation degree, sensitive and thin passivation layers which can be damaged easily, and mainstream passivation layers such as SiNx, $Al_2O_3$ and $SiO_2$.

The specific operation of the barrier layer paste and the back-side silver paste in coordination is as follows:

(1) powder is uniformly dispersed separately with dispersant for later use;

(2) preparation of organic binder: organic resin and organic additives are respectively soaked with organic solvent; more specifically, the organic resin is soaked while being heated and stirred under a temperature of about 90° C. for 1 hour, and thixotropic agent is soaked while being heated and stirred under a temperature of about 40° C. for 1 hour; the organic resin and the thixotropic agent are then mixed with other organic additives and organic solvent according to a certain proportion, giving an transparent and homogeneous organic binder;

(3) preparation of inorganic binder: after being weighed according to percentages by weight, various materials are dry-mixed in a V-type mixer, and after uniform mixing, the mixture is dried in a constant-temperature drying oven under about 200° C. for 2 hours; after being taken out, the mixture is sintered and smelted in a muffle furnace under 900° C. for 1 hour, and during melting, a high-temperature nitrogen vacuum-protected sintering technique is adopted, the application of which can overcome the technical problem on how to prepare low-melting-point, valence state-table glass powder; and after being taken out of the muffle furnace, the glass is cooled by cooling rolls, ball-milled, dried and screened, giving an inorganic binder for the back-side silver paste;

(4) preparation method for the back-side silver paste: silver powder, the organic binder, the inorganic binder and organic additive are dispersed and mixed according to a certain proportion, and the mixture is then ground six times to be uniformly dispersed by a three-roll grinder until the fineness is less than 15 μm, giving the prepared back-side silver paste in coordination;

(5) preparation method for the barrier layer paste: the pre-dispersed metal nitride powder and oxide powder, the organic binder, the inorganic binder and organic additive are dispersed and mixed according to a certain proportion, and the mixture is then ground six times to be uniformly dispersed by a three-roll grinder until the fineness is less than 15 μm, giving the prepared barrier layer paste.

Embodiment 2

A preparation method for a solar cell back electrode comprises the following steps: a layer of conductive barrier layer paste is printed or sprayed on back-side aluminum paste, and the barrier layer paste is directly printed on a back-side aluminum electrode; after drying, back-side silver paste in coordination is printed on the barrier layer paste and dried; and after sintering, a back electrode is formed.

The barrier layer paste comprises the following components: 60 parts by weight of metal nitride powder, nitrogen-silicon compound powder, oxide powder or low-melting-point metal powder in total; 5 parts by weight of lead-free glass powder; 34 parts by weight of organic binder; and 1 part by weight of organic additives.

The back-side silver paste in coordination comprises the following components: 40 parts by weight of hollow spherical silver powder with purity greater than 99.99% under special requirements; 20 parts by weight of flaky silver powder; 4 parts by weight of lead-free glass powder; 35 parts by weight of organic binder; and 1 part by weight of organic additives, wherein the grain size D50 of the hollow spherical silver powder is 3 μm, and the grain size D50 of the flaky silver powder is 5 μm.

The metal nitride powder comprises one or more of ZrN, TiN, TaN, MoN and CaN, with the grain size D50 being 0.5 μm.

The nitrogen-silicon compound powder comprises one or more of SiNx, BNx and VNx, with the grain size D50 being 0.7 μm.

The metal oxide powder comprises one or more of $Al_2O_3$, $SiO_2$, $TiO_2$, ZrO, $SnO_2$, $MoO_2$, CaO and NiO, with the grain size D50 being 0.6 μm.

The lead-free glass powder is prepared by: melting several of $Bi_2O_3$, $B_2O_3$, ZnO, $TeO_2$, $SiO_2$, $MnO_2$, CaO, $Al_2O_3$, CuO, SrO and BaO in parts by weight, with the grain size D50 being controlled at 1 μm and the softening point being adjustable within a range of 700° C.

The organic binder comprises the following components: 20 parts by weight of organic resin; 70 parts by weight of organic solvent; and 10 parts by weight of organic additives.

The lead-free glass powder is prepared by melting several of $Bi_2O_3$, $B_2O_3$, $SiO_2$, $Na_2O$, $MnO_2$, CaO, $Al_2O_3$, CuO, ZnO, SrO, BaO and $TeO_2$, with the grain size D50 being controlled at 3 μm and the softening point being adjustable within a range of 600° C.

The organic binder comprises the following components: 15 parts by weight of organic resin; 75 parts by weight of organic solvent; and 10 parts by weight of organic additives.

The barrier layer paste can be directly sprayed or printed on aluminum paste, back electrode width and printed pattern can be adjusted optionally, and the thickness is about 5 μm; and the barrier layer has a bidirectional barrier function, which not only can prevent the mutual diffusion between aluminum and silver, but also can prevent the mutual diffusion between silver and silicon.

An application of the preparation method for a barrier layer, in which the preparation method for a solar cell back electrode is applicable but not limited to PERC cell back electrodes, and is also applicable to full-area aluminum back surface field cells or cells with a high back side passivation degree, sensitive and thin passivation layers which can be damaged easily, and mainstream passivation layers such as SiNx, $Al_2O_3$ and $SiO_2$.

The specific operation of the barrier layer paste and the back-side silver paste in coordination is as follows:

(1) metal powders are uniformly dispersed separately with dispersant for later use;

(2) preparation of organic binder: organic resin and organic additives are respectively soaked with organic solvent; more specifically, the organic resin is soaked while being heated and stirred under a temperature of about 90° C. for 3 hours, and thixotropic agent is soaked while being heated and stirred under a temperature of about 40° C. for 2 hours; the organic resin and the thixotropic agent are then mixed with other organic additives and organic solvent according to a certain proportion, giving an transparent and homogeneous organic binder;

(3) preparation of inorganic binder: after being weighed according to percentages by weight, various materials are dry-mixed in a V-type mixer, and after uniform mixing, the mixture is dried in a constant-temperature drying oven under about 200° C. for 5 hours; after being taken out, the mixture is sintered and smelted in a muffle furnace under 1100° C. for 2 hour, and during melting, a high-temperature nitrogen vacuum-protected sintering technique is adopted, the application of which can overcome the technical problem on how to prepare low-melting-point, valence state-table glass powder; and after being taken out of the muffle furnace, the glass is cooled by cooling rolls, ball-milled, dried and screened, giving an inorganic binder for the full-area aluminum back surface field back-side silver paste;

(4) preparation method for the back-side silver paste: silver powder, the organic binder, the inorganic binder and organic additive are dispersed and mixed according to a certain proportion, and the mixture is then ground eight times to be uniformly dispersed by a three-roll grinder until the fineness is less than 15 μm, giving the prepared back-side silver paste in coordination;

(5) preparation method for the barrier layer paste: the pre-dispersed metal nitride powder and oxide powder, the organic binder, the inorganic binder and organic additive are dispersed and mixed according to a certain proportion, and the mixture is then ground eight times to be uniformly dispersed by a three-roll grinder until the fineness is less than 15 μm, giving the prepared barrier layer paste.

Embodiment 3

A preparation method for a solar cell back electrode comprises the following steps: a layer of conductive barrier layer paste is printed or sprayed on back-side aluminum paste, and the barrier layer paste is directly printed on a back-side aluminum electrode; after drying, back-side silver paste in coordination is printed on the barrier layer paste and dried; and after sintering, a back electrode is formed.

The barrier layer paste comprises the following components: 58 parts by weight of metal nitride powder, nitrogen-silicon compound powder, metal oxide powder or low-melting-point metal powder in total; 3.5 parts by weight of lead-free glass powder; 37.8 parts by weight of organic binder; and 0.7 parts by weight of organic additives.

The back-side silver paste in coordination comprises the following components: 45 parts by weight of hollow spherical silver powder with purity greater than 99.99% under special requirements; 18 parts by weight of flaky silver powder; 3 parts by weight of lead-free glass powder; 33.4 parts by weight of organic binder; and 0.6 parts by weight of organic additives, wherein the grain size D50 of the hollow spherical silver powder is 1.2 μm, and the grain size D50 of the flaky silver powder is 4.5 μm.

The metal nitride powder comprises one or more of ZrN, TiN, TaN, MoN and CaN, with the grain size D50 being 0.6 μm.

The nitrogen-silicon compound powder comprises one or more of SiNx, BNx and VNx, with the grain size D50 being 0.2 μm.

The metal oxide powder comprises one or more of $Al_2O_3$, $SiO_2$, $TiO_2$, ZrO, $SnO_2$, $MoO_2$, CaO and NiO, with the grain size D50 being 0.9 μm.

The lead-free glass powder is prepared by: melting several of $Bi_2O_3$, $B_2O_3$, ZnO, $TeO_2$, $SiO_2$, $MnO_2$, CaO, $Al_2O_3$, CuO, SrO and BaO in parts by weight, with the grain size D50 being controlled at 2.7 μm and the softening point being adjustable within a range of 600° C.

The organic binder comprises the following components: 20 parts by weight of organic resin; 75 parts by weight of organic solvent; and 5 parts by weight of organic additives.

The lead-free glass powder is prepared by melting several of $Bi_2O_3$, $B_2O_3$, $SiO_2$, $Na_2O$, $MnO_2$, CaO, $Al_2O_3$, CuO, ZnO, SrO, BaO and $TeO_2$, with the grain size D50 being controlled at 2.2 μm and the softening point being adjustable within a range of 500° C.

The organic binder comprises the following components: 16 parts by weight of organic resin; 80 parts by weight of organic solvent; and 4 parts by weight of organic additives.

The barrier layer paste can be directly sprayed or printed on aluminum paste, back electrode width and printed pattern can be adjusted optionally, and the thickness is about 3 μm; and the barrier layer has a bidirectional barrier function, which not only can prevent the mutual diffusion between aluminum and silver, but also can prevent the mutual diffusion between silver and silicon.

An application of the preparation method for a barrier layer, in which the preparation method for a solar cell back electrode is applicable but not limited to PERC cell back electrodes, and is also applicable to full-area aluminum back surface field cells or cells with a high back side passivation degree, sensitive and thin passivation layers which can be damaged easily, and mainstream passivation layers such as SiNx, $Al_2O_3$ and $SiO_2$.

The specific operation of the barrier layer paste and the back-side silver paste in coordination is as follows:

(1) low-melting-point nano metal powder is uniformly dispersed separately with dispersant for later use;

(2) preparation of organic binder: organic resin and organic additives are respectively soaked with organic solvent; more specifically, the organic resin is soaked while being heated and stirred under a temperature of about 90° C. for 2 hours, and thixotropic agent is soaked while being heated and stirred under a temperature of about 40° C. for 1.5 hours; the organic resin and the thixotropic agent are then mixed with other organic additives and organic solvent according to a certain proportion, giving an transparent and homogeneous organic binder;

(3) preparation of inorganic binder: after being weighed according to percentages by weight, various materials are dry-mixed in a V-type mixer, and after uniform mixing, the mixture is dried in a constant-temperature drying oven under about 200° C. for 3 hours; after being taken out, the mixture is sintered and smelted in a muffle furnace under 1000° C. for 1.5 hour, and during melting, a high-temperature nitrogen vacuum-protected sintering technique is adopted, the application of which can overcome the technical problem on how to prepare low-melting-point, valence state-table glass powder; and after being taken out of the muffle furnace, the glass is cooled by cooling rolls, ball-milled, dried and screened, giving an inorganic binder for the full-area aluminum back surface field back-side silver paste;

(4) preparation method for the back-side silver paste: silver powder, the organic binder, the inorganic binder and organic additive are dispersed and mixed according to a certain proportion, and the mixture is then ground seven times to be uniformly dispersed by a three-roll grinder until the fineness is less than 15 μm, giving the prepared back-side silver paste in coordination;

(5) preparation method for the barrier layer paste: the pre-dispersed metal nitride powder and oxide powder, the organic binder, the inorganic binder and organic additive are dispersed and mixed according to a certain proportion, and the mixture is then ground six to eight times to be uniformly dispersed by a three-roll grinder until the fineness is less than 15 μm, giving the prepared barrier layer paste.

Figure 5:
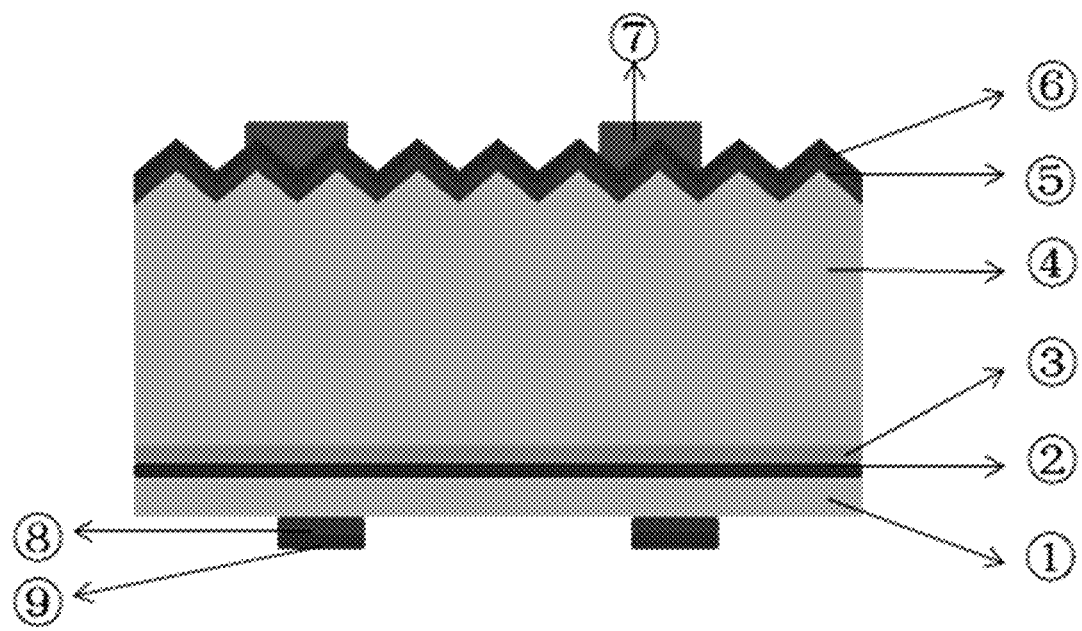
FIG. 5 is a schematic diagram of a cell structure of the disclosure, in which ① is PERC back surface field aluminum paste, ② ③ are anti-reflective film passivation layers (SiNx/Al2O3, etc.), ④ is a P-type silicon semiconductor substrate, ⑤ is an N-type impurity layer, ⑥ is an anti-reflective film passivation layer, ⑦ is a grid-type positive electrode, ⑧ is a barrier layer, and ⑨ is back-side silver.

A specific experimental test was carried out by the disclosure, and the test results are shown in Table 1: Test Result of Electric Property of Back Electrode and Table 2: Test Result of Reliability of Back Electrode. Electron microscopy images are shown as FIGS. 1-4. The schematic diagram of a cell structure of the disclosure is shown as FIG. 5.

TABLE 1

Test Result of Electric Property of Back Electrode (PERC Cell)

| Sample | Uoc/v | Isc/A | Rs/mΩ | Rsh/Ω | FF/% | Eta/% |
|---|---|---|---|---|---|---|
| Comparative Sample | 0.663 | 9.638 | 1.743 | 177 | 80.78 | 21.13 |
| Product | 0.664 | 9.643 | 1.770 | 249 | 80.88 | 21.16 |

TABLE 2

Test Result of Reliability of Back Electrode (PERC Cell)

| Sample | Tensile Strength/N | Aging Tensile Strength 0.5 h | Aging Tensile Strength 1 h | Tensile Strength After Poaching 85° C./0.5 h |
|---|---|---|---|---|
| Product 1 | 2.145 | 2.236 | 2.408 | 2.875 |
| Product 2 | 1.832 | 1.998 | 2.003 | 2.273 |

In the application of the solar cell back electrode of the disclosure, back electrode width and printed pattern can be adjusted optionally, thereby reducing the cost of back electrode paste. In order to reduce unit consumption and recombination, the printed pattern of the back-side silver paste may be hollowed out, strip hollowed out or dot hollowed out, with the blocking proportion being 25% to 50%.

The disclosure achieves the isolation between silver and aluminum and between silver and silicon by performing printing twice or multiple times, and the preparation method for a back electrode is applicable to full-area aluminum back surface field solar cells or solar cells with a high back side passivation degree. The application of the barrier layer can reduce the formation of silver-aluminum alloy, thus increasing the weldability and welding resistance of the paste and the welding tensile strength of the back electrode.

Since the silver powders with different grain sizes and shapes are chosen to be used in cooperation in the disclosure, the bulk density of a conducting film is increased, the contact area between silver particles is enlarged, the contraction force of the conducting film is decreased, and the electric conductivity of the paste is increased.

Since the back-side silver paste and barrier layer paste of the disclosure adopt lead-free glass powder, the use of leaded glass powder is avoided, thus better meeting the requirements of environmental protection. Moreover, the glass powder is adjusted to have appropriate activity, so that the glass powder and the silver powder have appropriate wettability, enabling the paste to have appropriate sintering temperature, and thereby the overall properties of the paste are improved.

The preparation method for a back electrode in the disclosure ensures that it has considerable welding tensile strength and aging tensile strength, and prevents the severe electric leakage problem caused by metal defects as a result of the direct contact between silver and a silicon wafer or aluminum paste, and thereby the photoelectric conversion efficiency of crystalline silicon cells can be increased.

What is claimed is:

1. A preparation method for a solar cell back electrode, comprising:
    printing or spraying a layer of conductive barrier layer paste on back-side aluminum paste;
    directly printing the conductive barrier layer paste on a back-side aluminum electrode;
    after drying, printing back-side silver paste in coordination on the conductive barrier layer paste; and
    after drying and sintering, forming the solar cell back electrode.

2. The preparation method for the solar cell back electrode of claim 1, wherein the conductive barrier layer paste comprises the following components:
    20 to 80 parts by weight of metal nitride powder, nitrogen-silicon compound powder, oxide powder or low-melting-point metal powder in total;
    0.5 to 5 parts by weight of lead-free glass powder;
    10 to 40 parts by weight of organic binder; and
    0.1 to 1 part by weight of organic additives.

3. The preparation method for the solar cell back electrode of claim 1, wherein the back-side silver paste in coordination comprises the following components:
    5 to 60 parts by weight of hollow spherical silver powder with purity greater than 99.99% under special requirements;
    5 to 30 parts by weight of flaky silver powder;
    0.5 to 5 parts by weight of lead-free glass powder;
    10 to 50 parts by weight of organic binder; and
    0.1 to 1 part by weight of organic additives,
    wherein a grain size D50 of the hollow spherical silver powder is 5 μm to 20 μm, and a grain size D50 of the flaky silver powder is 2 μm to 30 μm.

4. The preparation method for the solar cell back electrode of claim 2, wherein
    the metal nitride powder comprises one or more of ZrN, TiN, TaN, MoN and CaN, with a grain size D50 being 0.1 μm to 10 μm;
    the nitrogen-silicon compound powder comprises one or more of SiNx, BNx and VNx, with a grain size D50 being 0.3 μm to 15 μm; and
    the oxide powder comprises one or more of $Al_2O_3$, $SiO_2$, $TiO_2$, ZrO, $SnO_2$, $MoO_2$, CaO and NiO, with a grain size D50 being 0.3 μm to 15 μm.

5. The preparation method for the solar cell back electrode of claim 2, wherein the lead-free glass powder is prepared by: melting several of $Bi_2O_3$, $B_2O_3$, ZnO, $TeO_2$, $SiO_2$, $MnO_2$, CaO, $Al_2O_3$, CuO, SrO and BaO in parts by weight, with a grain size D50 being controlled at 0.7 μm to 5 μm and a softening point being adjustable within a range from 500° C. to 700° C.

6. The preparation method for the solar cell back electrode of claim 2, wherein the organic binder comprises the following components:
    1 to 30 parts by weight of organic resin;
    50 to 90 parts by weight of organic solvent; and
    0.5 to 10 parts by weight of organic additives.

7. The preparation method for the solar cell back electrode of claim 3, wherein the lead-free glass powder is prepared by melting several of $Bi_2O_3$, $B_2O_3$, $SiO_2$, $Na_2O$, $MnO_2$, CaO, $Al_2O_3$, CuO, ZnO, SrO, BaO and $TeO_2$, with a grain size D50 being controlled at 0.3 μm to 3 μm and a softening point being adjustable within a range from 400° C. to 600° C.

8. The preparation method for the solar cell back electrode of claim 3, wherein the organic binder comprises the following components:
    0.5 to 20 parts by weight of organic resin;
    40 to 90 parts by weight of organic solvent; and
    0.5 to 10 parts by weight of organic additives.

9. The preparation method for the solar cell back electrode of claim 1, comprising:
    directly spraying or printing the conductive barrier layer paste on the back-side aluminum paste; and
    adjusting optionally a solar cell back electrode width and a printed pattern, wherein a thickness of the conductive barrier layer paste is about 1 μm to 5 μm; and the conductive barrier layer has a bidirectional barrier function, which not only prevents a mutual diffusion between aluminum and silver, but also prevents a mutual diffusion between the silver and silicon.

10. A method of applying the preparation method for the solar cell back electrode of claim 1, comprising:

applying the preparation method for the solar cell back electrode to Passivated Emitter and Rear Contact cell back electrodes, full-area aluminum back surface field cells or cells with a high back side passivation degree, sensitive and thin passivation layers which can be damaged easily, or mainstream passivation layers such as SiNx, $Al_2O_3$ and $SiO_2$.

* * * * *